United States Patent
Lee et al.

(10) Patent No.: US 6,265,301 B1
(45) Date of Patent: Jul. 24, 2001

(54) METHOD OF FORMING METAL INTERCONNECT STRUCTURES AND METAL VIA STRUCTURES USING PHOTOLITHOGRAPHIC AND ELECTROPLATING OR ELECTRO-LESS PLATING PROCEDURES

(75) Inventors: Jin-Yuan Lee; Chen-Jong Wang, both of Hsin-chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/310,258

(22) Filed: May 12, 1999

(51) Int. Cl.$^7$ .............................................. H01L 21/4763
(52) U.S. Cl. ..................... 438/618; 438/678; 438/687; 257/758; 257/766
(58) Field of Search .................... 438/618, 622, 438/626, 627, 628, 678, 687; 257/758, 759, 766, 792; 427/98, 305

(56) References Cited

U.S. PATENT DOCUMENTS

| | | | |
|---|---|---|---|
| 3,876,434 | * 4/1975 | Dutkewych et al. | 106/1 |
| 3,907,621 | * 9/1975 | Polichette et al. | 156/18 |
| 3,930,963 | * 1/1976 | Polichette et al. | 204/15 |
| 3,962,494 | * 6/1976 | Nuzzi | 427/304 |
| 3,977,884 | * 8/1976 | Gulla et al. | 106/1 |
| 3,993,802 | * 11/1976 | Polichette et al. | 427/98 |
| 4,123,565 | * 10/1978 | Sumitomo et al. | 427/88 |
| 4,341,823 | * 7/1982 | Sexton et al. | 427/404 |
| 4,424,095 | * 1/1984 | Frisch et al. | 156/629 |
| 4,515,671 | * 5/1985 | Polan et al. | 204/228 |
| 4,567,066 | * 1/1986 | Schultz et al. | 427/305 |
| 4,585,515 | * 4/1986 | Maa | 156/643 |
| 4,767,662 | * 8/1988 | Battey et al. | 428/209 |
| 4,840,820 | * 6/1989 | Schultz et al. | 427/305 |
| 4,866,008 |   9/1989 | Brighton et al. | 437/189 |
| 4,920,639 | * 5/1990 | Yee | 29/846 |
| 5,024,858 | * 6/1991 | Burch | 427/123 |
| 5,063,169 |   11/1991 | De Bruin et al. | 437/41 |
| 5,118,385 | * 6/1992 | Kumar et al. | 156/644 |
| 5,137,597 | * 8/1992 | Curry, II et al. | 156/636 |
| 5,149,615 | * 9/1992 | Chakravorty et al. | 430/313 |
| 5,162,260 |   11/1992 | Leibovitz et al. | 437/195 |
| 5,169,680 | * 12/1992 | Ting et al. | 427/96 |
| 5,309,632 | * 5/1994 | Takahashi et al. | 29/852 |
| 5,316,974 |   5/1994 | Crank | 437/190 |
| 5,399,425 | * 3/1995 | Burch | 428/328 |
| 5,514,449 | * 5/1996 | Tingerthal et al. | 428/195 |
| 5,529,956 |   6/1996 | Morishita | 437/195 |
| 5,656,414 | * 8/1997 | Chou et al. | 430/312 |
| 5,675,187 | * 10/1997 | Numata et al. | 257/758 |
| 5,705,416 | * 1/1998 | Kim et al. | 438/257 |
| 5,736,457 | * 4/1998 | Zhao | 438/624 |
| 5,747,880 | * 5/1998 | Havemann et al. | 257/759 |
| 5,759,911 | * 6/1998 | Cronin et al. | 438/622 |
| 6,027,861 | * 2/2000 | Yu et al. | 430/316 |
| 6,036,809 | * 3/2000 | Kelly et al. | 156/247 |
| 6,060,181 | * 5/2000 | Stolk | 428/694 T |

OTHER PUBLICATIONS

Chakravorty et al., IEEE Trans, Comp., Hybrids, and manuf., technol. 13/1 (1990) pp. 200–206, Mar. 1990.*

* cited by examiner

*Primary Examiner*—Olik Chaudhuri
*Assistant Examiner*—Ginette Peralta
(74) *Attorney, Agent, or Firm*—George O. Saile; Stephen B. Ackerman

(57) ABSTRACT

A process for forming metal interconnect structures, and metal via structures, using electroplating, or electroless plating procedures, has been developed. The process features the use of disposable conductive layers, used as seed layers for the plating procedures. After formation of the desired metal structures, on the portion of seed layer, exposed in an opening in the photoresist shape, the photoresist shape, and the underlying portion of the disposable conductive layer, are removed, resulting in the desired metal structures.

20 Claims, 4 Drawing Sheets

METHOD OF FORMING METAL INTERCONNECT STRUCTURES AND METAL VIA STRUCTURES USING PHOTOLITHOGRAPHIC AND ELECTROPLATING OR ELECTRO-LESS PLATING PROCEDURES

BACKGROUND OF THE INVENTION (1) Field of the Invention

The present invention relates to methods used to fabricate semiconductor devices, and more specifically to methods used to create metal interconnect structures, and metal via structures, for semiconductor devices.

(2) Description of Prior Art

The semiconductor industry is continually striving to improve the performance of semiconductor devices, while still attempting to decrease the processing costs of semiconductor chips. These objectives have been successfully addressed via micro-miniaturization, or the ability to fabricate semiconductor devices, comprised with sub-micron features. The sub-micron features allow performance degrading capacitances to be reduced. In addition the use of sub-micron features, allow smaller semiconductor chips to be obtained, however still possessing the same, or greater, device densities, as counterparts fabricated using larger features. This results in the attainment of more semiconductor chips, from a specific size, starting substrate, thus reducing the processing cost of the sub-micron, semiconductor chip.

The success of micro-miniaturization can be attributed to advances in specific semiconductor fabrication disciplines such as photolithography and dry etching. The use of more sophisticated exposure cameras, as well as the use of more sensitive photoresist materials, have allowed sub-micron images in photoresist layers, to be routinely achieved. In addition the development of more advanced dry etching tools and processes, have allowed the sub-micron images, in masking photoresist layers, to be successfully transferred to underlying materials, used to fabricate semiconductor devices. However in addition to the contributions of advanced semiconductor disciplines, specific processing procedures, such as damascene, and dual damascene patterning, have been used to create, high aspect ratio, metal interconnect, and metal via structures, comprised with sub-micron features. However the damascene procedures, entailing forming the damascene, or dual damascene pattern, in. an insulator layer, followed by metal deposition, in the damascene opening, requires the use of "glue", or adhesive layers, permanently located, underlying the metal structures, formed in the damascene opening. The "glue" or adhesive layer, now part of the metal structure, increases the resistance of the metal structure, for a specific cross-sectional area.

This invention will teach semiconductor procedures needed to create high aspect ratio, metal interconnect structures, and metal via structures, using electro-plating, or electro-less plating, metal procedures, thus avoiding the need for "glue" or adhesive layers, used with the conventional metal filling of damascene openings. The metal interconnect, and metal via structures, formed via use of this invention, will use a disposable conductive layer, or seed layer, thus not adversely influencing the conductivity of the resulting metal structure. Prior art, such as Brighton et al, in U.S. Pat. No. 4,866,008, describe the formation of metal structures, via electroplating procedures, however the final metal structures include the underlying seed layers, which adversely influence the ability to obtain the desired conductivity, for the metal structures.

SUMMARY OF THE INVENTION

It is object of this invention to fabricate metal interconnect structures, and metal via structures, via the opening of a desired metal structure shape, in a photoresist layer, followed by formation of the desired metal pattern, via a metal electroplating, or electro-less plating procedure, in the opening in the photoresist layer.

It is another object of this invention to deposit a disposable conductive layer, followed by formation of a defining, overlying shape, such as a photoresist, an organic, or a dielectric shape, exposing a portion of the disposable conductive layer, in the opening in the overlying shape.

It is still another object of this invention to electroplate, or electro-less plate, the desired metal pattern, in the opening in the photoresist shape, using the portion of disposable conductive layer, located under the defining shape, as a seed layer.

It is still yet another object of this invention to remove the portion of disposable conductive layer, not covered by the desired metal pattern, after removal of the overlying defining shape.

In accordance with the present invention a method of fabricating metal interconnect structures, and metal via structures, for semiconductor devices, using metal plating procedures, featuring underlying, disposable conductive layers, has been developed. A first disposable conductive layer is formed on an underlying, first metal via structure, followed by the formation of a first defining shape, comprised of an organic material, such as a photoresist, or comprised of a dielectric layer, featuring an opening, which exposes the top surface of the first metal via structure. A metal interconnect structure is formed on the portion of the first disposable conductive layer, exposed in the opening, in the first defining shape, via an electroplating, or electro-less plating procedure. After removal of the first defining shape, and removal of the portion of first disposable conductive layer, not covered by the metal interconnect structure, a dielectric layer is deposited, and planarized, exposing the top surface of the metal interconnect structure. After deposition of a second disposable conductive layer, overlying the exposed top surface of the metal interconnect structure, as well as overlying the planarized top surface of the dielectric layer, a second defining shape, comprised of either photoresist, other organic materials, or a dielectric, is formed, featuring an opening that exposes a region of the second disposable conductive layer, that directly overlays a portion of the top surface of the metal interconnect structure. A second metal via structure, or metal pillar structure, is formed on the portion of the second. disposable conductive layer, exposed in the opening in the second defining shape, via electroplating, or electro-less plating, procedures. After removal of the second defining shape, the portion of the second disposable conductive layer, not covered by the second metal via structure, is removed.

BRIEF DESCRIPTION OF THE DRAWINGS

The object and other advantages of this invention are described in the preferred embodiment with reference to the attached drawings that include.

DESCRIPTION OF THE PREFERRED EMBODIMENTS

A method used to fabricate metal interconnect structures, and metal via structures, using electroplating and electro-less plating procedures, performed in openings in defining shapes, such as photoresist shapes, and featuring disposable conductive layers, used to enhance the plating procedures, will now be describe in detail.

Figure 1:
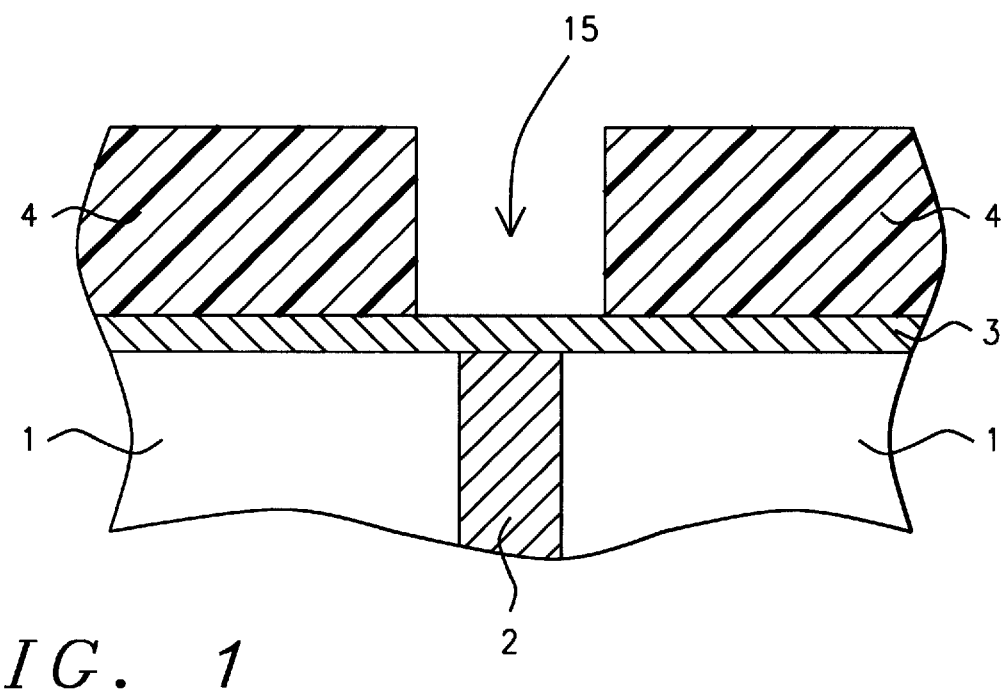
FIGS. 1, 2, 3, 4, 5, 6B, and 6C, which schematically, in cross-sectional style, show the key stages of fabrication used to create metal interconnect structures, and metal via structures, via the use of electroplating procedures, featuring underlying, disposable conductive layers.

FIG. 1, shows a first metal via structure 2, in a first dielectric layer 1. First dielectric layer 1, can be comprised of silicon oxide, or boro-phosphosilicate glass, (BPSG), while first metal via structure 2, can be comprised of either copper, tungsten, tungsten silicide, or aluminum, or an aluminum based layer, such as aluminum-copper. First metal via structure 2, overlays and contacts, either an active device region in an underlying semiconductor substrate, (not shown in the drawings), or an underlying metal interconnect structure, (not shown in the drawings). First dielectric layer 1, in which a contact hole, or a via hole, would be formed in, to accept first metal via structure 2, would be formed on either the semiconductor substrate, or the underlying metal interconnect structure. A first disposable conductive layer 3, is formed on a planarized top surface, comprised of the top surface of first dielectric layer 1, and the top surface of first metal via structure 2. First disposable conductive layer 3, is comprised of either titanium, titanium nitride, tantalum nitride, or copper on tantalum nitride, obtained via R.F. sputtering procedures, at a thickness between about 500 to 1000 Angstroms. The conductive layer will serve as a seed layer for deposition of a subsequent electroplated, metal layer. A first defining shape 4, which can be comprised of photoresist, silicon oxide, silicon nitride, or other low dielectric constant organic, or inorganic materials, is next formed on first disposable conductive layer 3, with opening 15, exposing a first portion of first disposable conductive layer 3, in a region in which first disposable conductive layer 3, directly overlays the top surface of first metal via structure 2. In this description the defining shapes, will be comprised of photoresist. This is schematically shown in FIG. 1. The disposable conductive layers used in this invention, provide the seed layer needed to perform the subsequent electroplated and electro-less plated procedures, used to create the desired metal interconnect, and metal plug structures.

Figure 2:
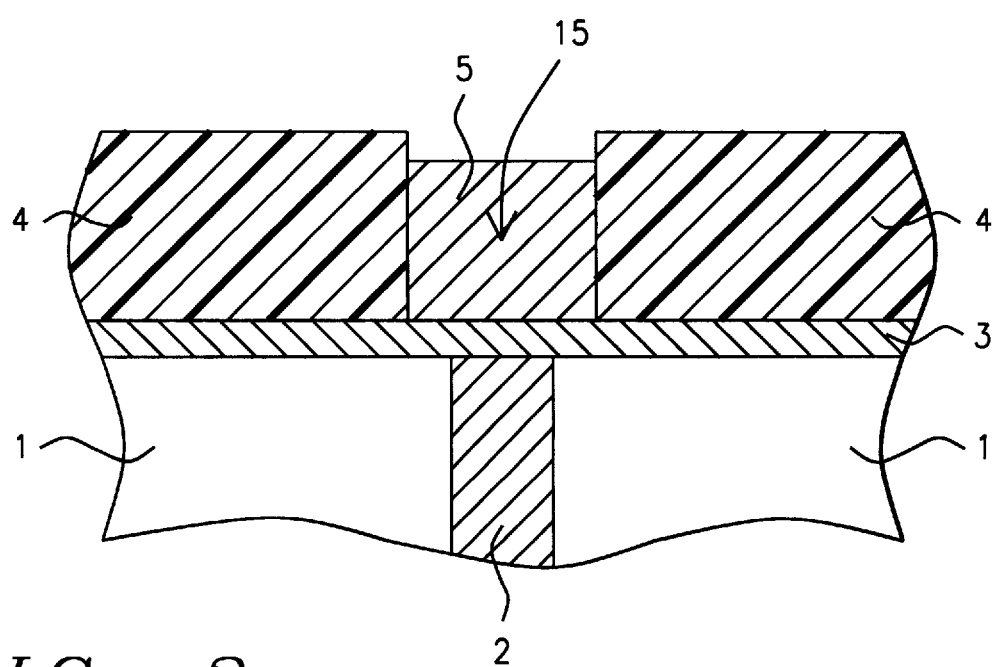

A metal interconnect structure 5, shown schematically in FIG. 2, is next formed in opening 15, via an electroplated, or via an electro-less plated, procedure. Metal interconnect structure 5, comprised of copper, at a thickness between about 2000 to 10000 Angstroms, can be obtained via an electroplating procedure, accomplished at a temperature between about 20 to 40° C., at a current density, between about 0.01 to 0.05 amps/cm$^2$, using a CuSO$_4$ based solution. Metal interconnect structure 5, shown schematically in FIG. 2, is shown as a copper structure, however if desired, metal interconnect structure 5, can be comprised of nickel, obtained via an electroplating procedure, using a solution of NiSO$_4$, NiCl$_2$, and H$_3$BO$_3$, based at a temperature between about 40 to 70° C., at a current density between about 0.01 to 0.05 amps/cm$^2$, or using an electro-less plating procedure, using a solution of NiCl$_2$ and (CH$_3$)$_2$NHBH$_3$, at a temperature between about 60 to 70° C.

Figure 3:
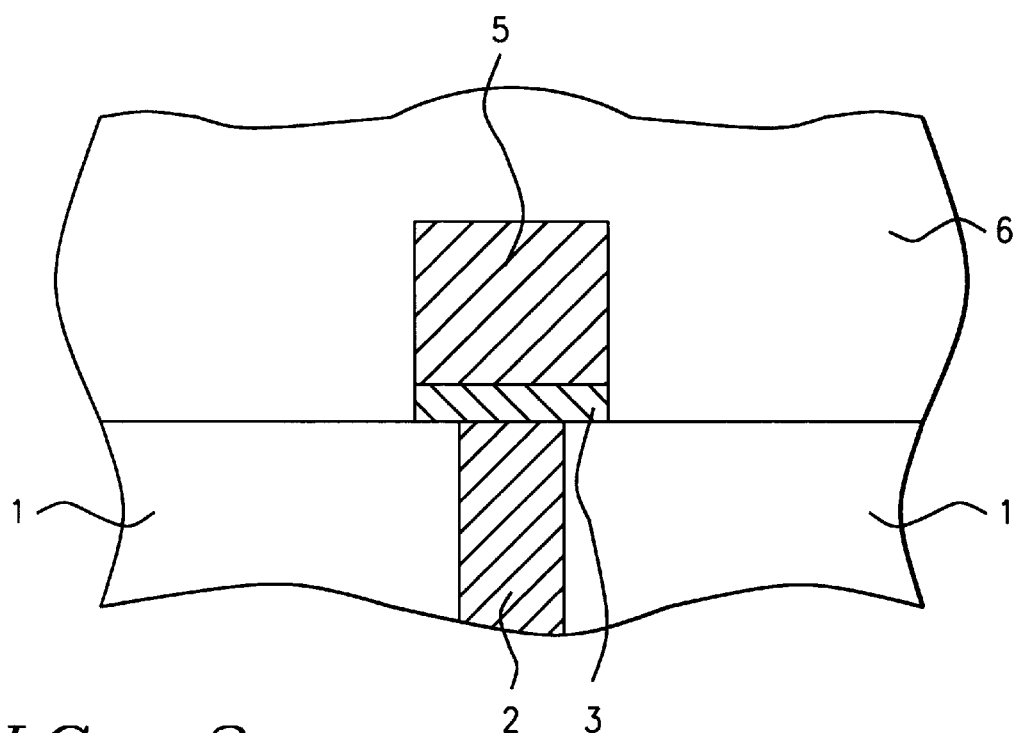

After removal of photoresist shape 4, via plasma oxygen ashing and careful wet cleans, the portion of first disposable conductive layer 3, not covered by metal interconnect structure 5, is selectively removed, via a RIE procedures, using Cl$_2$ or BCl$_3$ as an etchant. A second dielectric layer 6, comprised of silicon oxide, or of polyimide, is next deposited to a thickness between about 5000 to 15000 Angstroms, completely covering metal interconnect structure 5. The silicon oxide option, for second dielectric layer 6, is obtained via a plasma enhanced chemical vapor deposition, (PECVD), procedure, while the polyimide option, for second dielectric layer 6, is obtained via spin on coating, and curing procedures. This is schematically shown in FIG. 3.

Figure 4:
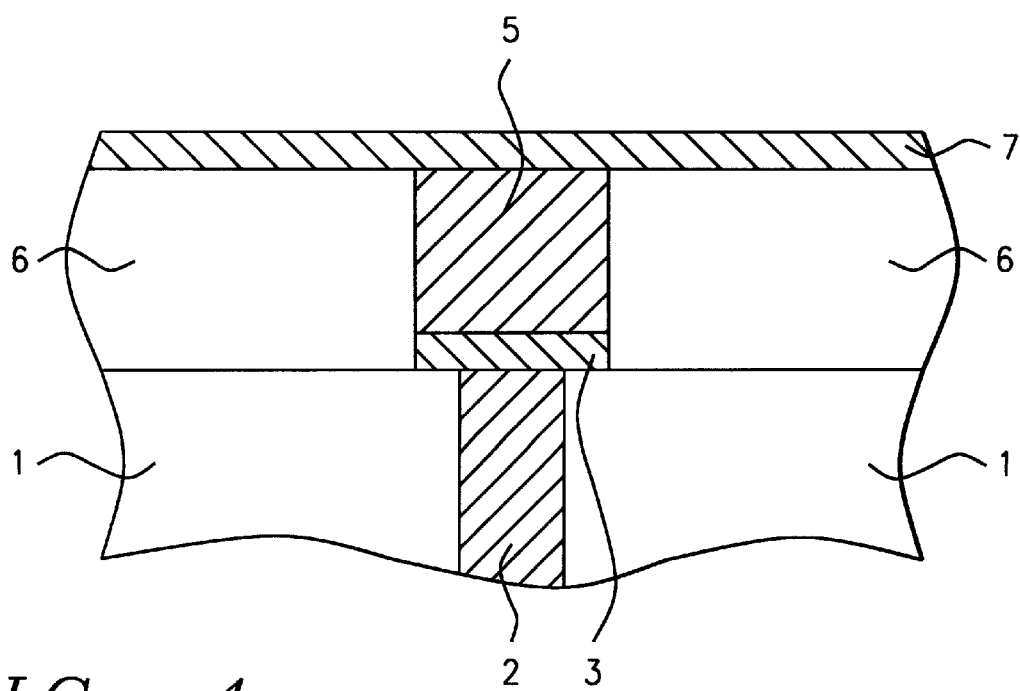

A chemical mechanical polishing procedure, is next employed to planarize the top surface of second dielectric layer 6, to create a smooth top surface, as well as to expose the top surface of metal interconnect structure 5. A second disposable conductive layer 7, is next formed on the smooth top surface of second dielectric layer 6, also overlying, and contacting, the top surface of metal interconnect structure 5. Second disposable conductive layer 7, shown schematically in FIG. 4, is again comprised of a titanium layer, obtained at a thickness between about 500 to 1000 Angstroms, via R.F. sputtering procedures.

Figure 5:
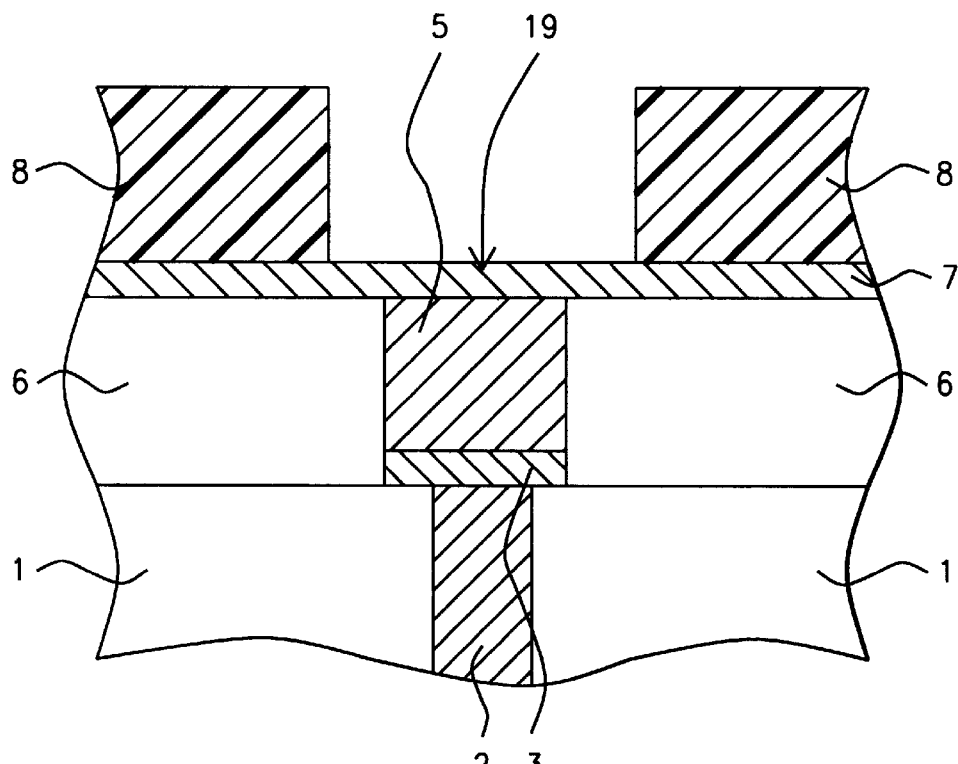

A second defining shape 8, such as a photoresist shape, a silicon oxide, or silicon nitride shape, or a low dielectric constant, organic, or inorganic material, shape, is next formed on second disposable conductive layer 7, featuring opening 19, which exposes a first portion of second disposable conductive layer 7, in a region in which second disposable conductive layer 7, overlays a portion of metal interconnect structure 5. This is schematically shown in FIG. 5.

Figure 6A:
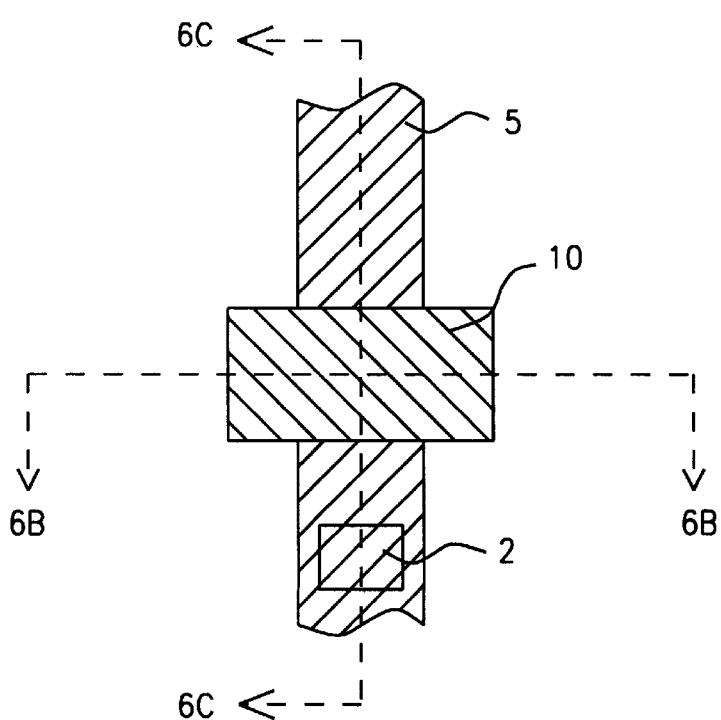
FIG. 6A, which schematically shows a top view of the metal interconnect structure, and the metal via structure, obtained via the electroplating procedures.
Figure 6B:
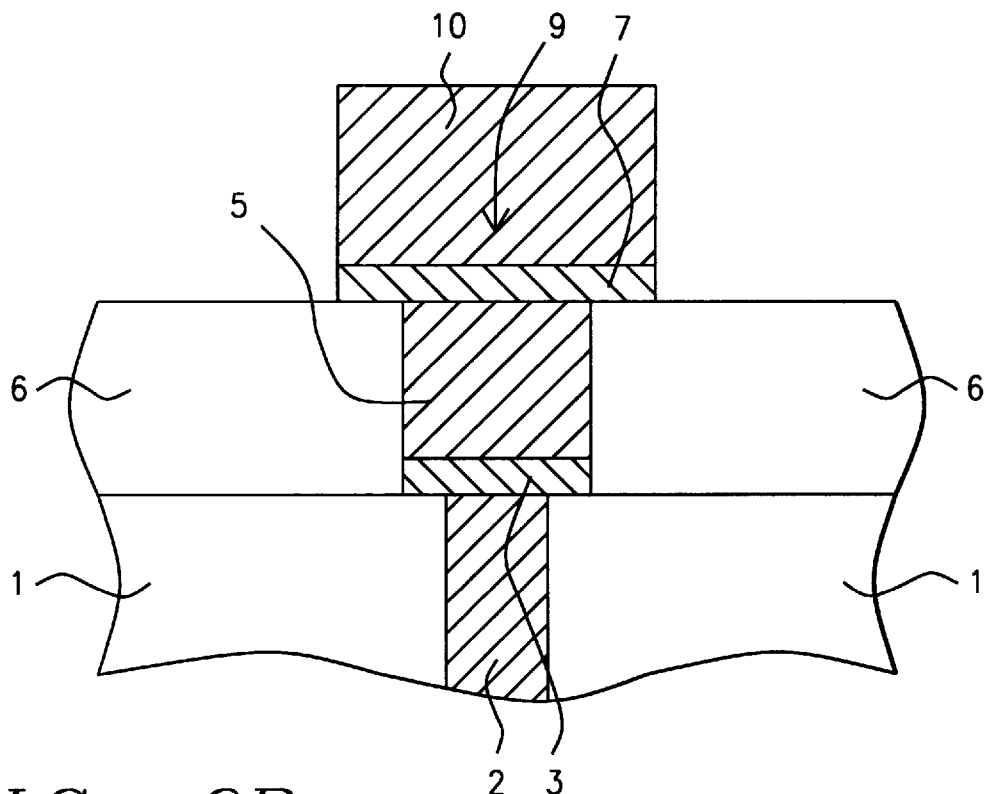
Figure 6C:
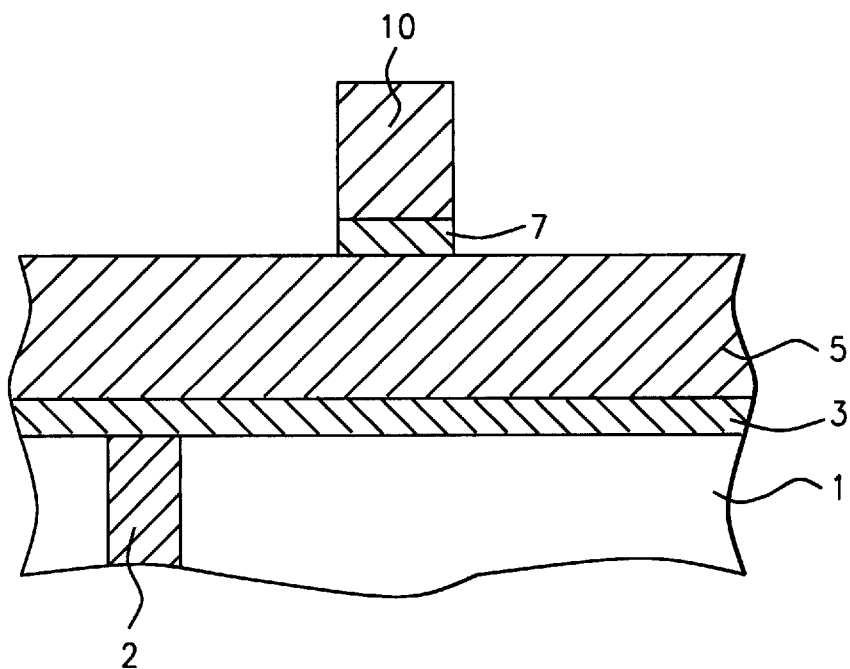

A metal via structure, or metal pillar structure 10, is next formed on the portion of second disposable conductive layer 7, exposed in opening 19, via electroplating, or electro-less plating, procedures, overlying and contacting a portion of the top surface of metal interconnect structure 5. Metal via structure, or metal pillar structure 10, is again comprised of copper, at a thickness between about 5000 to 15000 Angstroms, and formed using the identical electroplating, or electro-less plating conditions, previously used to form metal interconnect structure 5. The bottom of second disposable conductive layer 7, exposed at the perimeter of opening 19, provides the seed layer needed for the electroplated, or electro-less plated procedure. After removal of defining, or photoresist shape 8, via plasma oxygen ashing and careful wet cleans, the portion of the second disposable conductive layer 7, not covered by metal via structure 10, is selectively removed from the top surface of second dielectric layer 6, using conditions identical to the conditions previously used to selectively remove the desired portions of first disposable conductive layer 3, from the top surface of first dielectric layer 1. This is schematically shown, in cross-sectional style, for one direction, in FIG. 6B, and shown schematically, for a second direction, in FIG. 6C. FIG. 6A, schematically shows a top view of a configuration comprised of metal pillar structure 10,— metal interconnect structure 5—metal via structure 2, formed via electroplating, or electro-less plating procedures, accomplished using disposable conductive layers, as seed layers.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating metal interconnect structures, and metal via structures, on a semiconductor substrate, comprising the steps of:

providing a first metal via structure, in a first insulator layer, with the top surface of the first metal via structure, exposed;

depositing a blanket first disposable conductive layer on a planar top surface topography, comprised of the top surface of said first insulator layer, and comprised of the top surface of said first metal via structure;

forming a first defining shape, on said blanket first disposable conductive layer, with a first opening, in said first defining shape, exposing a first portion of said blanket first disposable conductive layer that directly overlays the top surface of said first metal via structure;

forming an electroplated copper interconnect structure, on the portion of said blanket first disposable conductive layer, exposed in said first opening, of said first defining shape;

removing said first defining shape;

removing the portion of said blanket first disposable conductive layer, not covered by said electroplated copper interconnect structure, from the top surface of said first insulator layer using said electroplated copper interconnect structure as an etch mask;

depositing a second insulator layer;

planarizing said second insulator layer, exposing the top surface of said metal interconnect structure;

depositing a blanket second disposable conductive layer, on a planarized top surface of said second insulator layer;

forming a second defining shape, on said blanket second disposable conductive layer, with a second opening, in said second defining shape, exposing the portion of said blanket second disposable conductive layer that directly overlays a portion of the top surface of said electroplated copper interconnect structure;

forming a second metal via structure, comprised of electroplated copper, on the portion of said blanket second disposable conductive layer, exposed in said second opening, in said second defining shape;

removing said second defining shape; and removing the portion of said blanket second disposable conductive layer, not covered by said second metal via.

2. The method of claim 1, wherein said first disposable conductive layer, is comprised of titanium, titanium nitride, tantalum nitride, or copper on tantalum nitride, obtained via R.F. sputtering, at a thickness between about 500 to 1000 Angstroms.

3. The method of claim 1, wherein said defining shape is comprised of photoresist, a low dielectric constant organic, or inorganic materials, silicon oxide, or silicon nitride.

4. The method of claim 1, wherein said electroplated copper interconnect structure, is formed to a thickness between about 2000 to 10000 Angstroms, via an electroplating procedure, performed at a temperature between about 20 to 40° C., at a current density between about 0.01 to 0.05 amps/cm$^2$, using a plating solution comprised of a CuSO$_4$ based solution.

5. The method of claim 1, wherein the portion, of said first disposable conductive layer, not covered by said electroplated copper interconnect structure, is removed via a selective RIE procedure, using Cl$_2$ as an etchant.

6. The method of claim 1, wherein said second insulator layer, is a silicon oxide layer, obtained via PECVD procedures, at a thickness between about 5000 to 15000 Angstroms.

7. The method of claim 1, wherein said second insulator layer is a polyimide layer, obtained via spin on coating, and curing procedures, at a thickness between about 5000 to 15000 Angstroms.

8. The method of claim 1, wherein said second disposable conductive layer, is comprised of titanium, titanium nitride, tantalum nitride, or copper on tantalum nitride, obtained via R.F. sputtering, at a thickness between about 500 to 1000 Angstroms.

9. The method of claim 1, wherein said second defining shape is comprised of photoresist, silicon oxide, silicon nitride, or a low dielectric constant, organic, or inorganic material.

10. The method of claim 1, wherein said second metal via structure is comprised of copper, formed via an electroplating procedure, to a thickness between about 5000 to 15000 Angstroms, performed at a temperature between about 20 to 40° C., at a current density between about 0.01 to 0.05 amps/cm$^2$, in a CuSO$_4$, based, plating solution.

11. The method of claim 1, wherein the portion, of said second disposable conductive layer, not covered by said metal via structure, is removed via a selective RIE procedure, using Cl$_2$ as an etchant.

12. A method of forming nickel interconnect structures, and nickel via structures, on a semiconductor substrate, via electroplating, or electro-less plating procedures, and featuring the use of blanket disposable conductive layers, formed on underlying planarized surfaces, used to enhance the plating procedures, comprising the steps of:

providing a metal via structure, located in a via hole in a first insulator layer;

depositing a blanket first disposable conductive layer, on a planarized top surface of said first insulator layer, and on the top surface of said metal via structure;

forming a first photoresist shape, on said blanket first disposable conductive layer, with a first opening, in said first photoresist shape, exposing a first portion of said blanket first disposable conductive layer that directly overlays the top surface of said metal via structure;

performing a first electroplating procedure, or a first electro-less plating procedure, to form said nickel interconnect structure, on said first portion of said blanket first disposable conductive layer, exposed in said first opening, in said first photoresist shape;

removing said first photoresist shape, exposing a second portion of said blanket first disposable conductive layer, not covered by said nicked interconnect structure;

selectively removing said second portion of said blanket first disposable conductive layer, from the top surface of said first insulator layer, using said nickel interconnect structure as an etch mask;

depositing a second insulator layer;

performing a chemical mechanical polishing procedure to planarize the top surface of said second insulator layer, and to expose the top surface of said nickel interconnect structure;

depositing a blanket second disposable conductive layer;

forming a second photoresist shape, on said blanket second disposable conductive layer, with a second opening, in said second photoresist shape, exposing a first portion, of said blanket second disposable conductive layer that directly overlays a portion of said nickel interconnect structure;

performing a second electroplating procedure, or a second electro-less plating procedure, to form said nickel via structure, on said first portion of said blanket second disposable conductive layer, exposed in said second opening, in said second photoresist shape;

removing said second photoresist shape, exposing a second portion of said blanket second disposable conductive layer, not covered by said nickel via structure; and removing said second portion, of said second disposable conductive layer, using said nickel via structure as an etch mask.

13. The method of claim 12, wherein said first disposable conductive layer is comprised of titanium, titanium nitride, tantalum nitride, or copper on tantalum nitride, obtained via R.F. sputtering, at a thickness between about 500 to 1000 Angstroms.

14. The method of claim 12, wherein said nickel interconnect structure is formed at a thickness between about 2000 to 10000 Angstroms, via said first electro-less plating procedure, performed at a temperature between about 60 to 70° C., using a plating solution of $NiCl_2$ and $(CH_3)_2NHBH_3$.

15. The method of claim 12, wherein said second portion, of said first disposable conductive layer, is removed via a selective RIE procedure, using $Cl_2$ as an etchant.

16. The method of claim 12, wherein said second insulator layer is a silicon oxide layer, obtained via PECVD procedures, at a thickness between about 5000 to 15000 Angstroms.

17. The method of claim 12, wherein said second insulator layer is a polyimide layer, obtained via a spin on, and a curing procedure, at a thickness between about 5000 to 1500 Angstroms.

18. The method of claim 12, wherein said second disposable conductive layer is comprised of either titanium, titanium nitride, tantalum nitride, or copper on tantalum nitride, obtained via R.F. sputtering, at a thickness between about 500 to 1000 Angstroms.

19. The method of claim 12, wherein said nickel via structure is formed at a thickness between about 5000 to 15000 Angstroms, via said second electro-less plating procedure, performed at a temperature between about 60 to 70° C, in a $NiCl_2$ and $(CH_3)_2NHBH_3$ plating solution.

20. The method of claim 12, wherein said second portion, of said second disposable conductive layer, is removed via a selective RIE procedure, using $Cl_2$ as an etchant.

* * * * *